United States Patent
Ylilammi et al.

(10) Patent No.: US 6,839,946 B2
(45) Date of Patent: Jan. 11, 2005

(54) METHOD FOR FABRICATING A THIN FILM BULK ACOUSTIC WAVE RESONATOR (FBAR) ON A GLASS SUBSTRATE

(75) Inventors: Markku Antero Ylilammi, Espoo (FI); Meeri Talvikki Partanen, Espoo (FI)

(73) Assignee: Nokia Corporation, Espoo (FI)

( * ) Notice: Subject to any disclaimer, the term of this patent is extended or adjusted under 35 U.S.C. 154(b) by 85 days.

(21) Appl. No.: 10/278,612

(22) Filed: Oct. 22, 2002

(65) Prior Publication Data

US 2003/0102773 A1 Jun. 5, 2003

Related U.S. Application Data

(62) Division of application No. 08/734,467, filed on Oct. 17, 1996, now abandoned.

(51) Int. Cl.[7] .......................... H04R 17/00; H01L 41/04; H01L 41/08; H01L 41/18
(52) U.S. Cl. .......................... 29/25.35; 29/594; 29/846; 29/847; 29/852; 310/321
(58) Field of Search ................................ 29/25.35, 594, 29/846, 847, 852; 216/13, 83; 333/187–191; 310/321, 322, 324, 334, 366

(56) References Cited

U.S. PATENT DOCUMENTS

| 3,173,100 A | 3/1965 | White | 330/35 |
| 3,293,557 A | 12/1966 | Dentor | 330/4.6 |
| 3,486,046 A | 12/1969 | Zalar | 310/8 |

(List continued on next page.)

FOREIGN PATENT DOCUMENTS

| EP | 609555 A2 | 12/1993 |
| EP | 709911 A2 | 5/1996 |
| JP | 62-76913 A | 9/1987 |
| JP | IEEE publiction | * 5/1995 |

OTHER PUBLICATIONS

"Acoustic Bulk Wave Composite Resonators", K. Lakin, Appl. Phys. Lett. 38(3). Feb. 1, 1981, pp. 125–127.

"Systematic Design of Stacked–Crystal Filters by Microwave Network Methods", A. Ballato, IEEE Trans. Of Microwave Theory and Techniques, vol., MTT–22, No. 1, Jan., 1974, pp. 14–25.

"Multi–Layered Ultrasonic Transducers Employing Air–Gap Structure", S. Yoshimoto, IEEE Trans. Of Ultra–sonic . . . vol., 42 No. 3, May 1995 pp. 339–343.

*Primary Examiner*—A. Dexter Tugbang
*Assistant Examiner*—Tai Van Nguyen
(74) *Attorney, Agent, or Firm*—Harrington & Smith, LLP

(57) ABSTRACT

A method for fabricating a Thin Film Bulk Acoustic Wave Resonator (FBAR). The method comprises the steps of: (A) forming a sacrificial layer comprising one of a metal and a polymer over a selected portion of a substrate; (B) forming a protective layer on the sacrificial layer and on selected portions of the substrate; (C) forming a bottom electrode layer on a selected portion of the protective layer; (D) forming a piezoelectric layer on a selected portion of the bottom electrode layer and on a selected portion of the protective layer; (E) forming a top electrode on a selected portion of the piezoelectric layer; and (F) removing the sacrificial layer to form an air gap. The use of a metal or a polymer material to form sacrificial layers has several advantages over the use of zinc-oxide (ZnO) to form such layers. In accordance with a further aspect of the invention, an FBAR is provided which includes a glass substrate. The use of glass to form substrates offers several advantages over the use of other materials to form substrates. By example, most types of glass are less expensive than semiconductor materials, and exhibit low permittivity characteristics, and low parasitic capacitances. In addition, most glass materials are substantially loss free when being used in microwave frequency applications.

17 Claims, 5 Drawing Sheets

U.S. PATENT DOCUMENTS

| | | | |
|---|---|---|---|
| 3,568,108 A | 3/1971 | Poirier et al. | 333/30 |
| 3,686,579 A | 8/1972 | Everett | 330/5.5 |
| 3,696,312 A | 10/1972 | Kuhn et al. | 333/24 R |
| 3,760,471 A | 9/1973 | Borner | 29/25.35 |
| 3,764,928 A | 10/1973 | Gires et al. | 330/5.5 |
| 3,916,490 A | 11/1975 | Sheahan et al. | 29/25.35 |
| 3,924,312 A | 12/1975 | Coussot et al. | 29/25.35 |
| 4,019,181 A | 4/1977 | Olsson et al. | 343/6.5 |
| 4,166,967 A | 9/1979 | Benes et al. | 310/338 |
| 4,320,365 A | 3/1982 | Black et al. | 333/187 |
| 4,365,216 A | 12/1982 | Minagawa et al. | 333/153 |
| 4,418,299 A | 11/1983 | Momosaki | 310/361 |
| 4,456,850 A | 6/1984 | Inoue et al. | 310/324 |
| 4,502,932 A | 3/1985 | Kline et al. | 204/192 |
| 4,556,812 A | 12/1985 | Kline et al. | 310/324 |
| 4,562,370 A | 12/1985 | Von Dach | 310/312 |
| 4,642,508 A * | 2/1987 | Suzuki et al. | 310/321 |
| 4,897,618 A | 1/1990 | Svetanoff | 331/76 |
| 5,153,476 A | 10/1992 | Kosinski | 310/313 R |
| 5,162,691 A | 11/1992 | Mariani et al. | 310/321 |
| 5,166,646 A | 11/1992 | Avanic et al. | 331/107 A |
| 5,185,589 A | 2/1993 | Krishnaswamy et al. | 333/133 |
| 5,233,259 A | 8/1993 | Krishnaswamy et al. | 310/324 |
| 5,332,943 A | 7/1994 | Bhardwaj | 310/326 |
| 5,373,268 A | 12/1994 | Dworsky et al. | 333/187 |
| 5,382,930 A | 1/1995 | Stokes et al. | 333/191 |
| 5,422,533 A | 6/1995 | Kosinski et al. | 310/335 |
| 5,446,306 A | 8/1995 | Stokes et al. | 257/416 |
| 5,587,620 A | 12/1996 | Ruby et al. | 310/346 |
| 5,596,239 A | 1/1997 | Dydyk | 210/311 |
| 5,629,906 A | 5/1997 | Sudol et al. | 367/162 |
| 5,646,583 A | 7/1997 | Seabury et al. | 333/187 |
| 5,692,279 A | 12/1997 | Mang et al. | 29/25.35 |
| 5,714,917 A * | 2/1998 | Ella | 332/144 |
| 5,929,723 A * | 7/1999 | Kimura et al. | 333/193 |

OTHER PUBLICATIONS

"Design of Unapodized Surface–Wave Transducers with Spectral Weighting", G. Nudd, IEEE Trans. on Microwave Theory and Techniques, Vo., MTT–22, No. 1, Jan. 1974, pp. 14–23.

"Development of Miniature Filters for Wireless Applications", K. Lakin et al., IEEE MTT–S Digest, 1995, pp. 883–886.

"An Air Gap Type Piezoelectric Composite Thin Film Resonator", H. Satoh et al., IEEE, 1985, pp. 361–366.

"Coplanar Waveguides and Microwave Indicators on Silicon Substrates", A. Reyes, IEEE, 1995, pp. 2016–2021.

"Ultrasonic in Integrated Electronics", W. Newell, Proceedings of the IEEE, pp. 1305–1309.

"Thin Film Bulk Acoustic Wave Filters for GPS" Lakin et al., IEEE 1992 pp 471–476.

"Recent Advances in Monolithic Film Resonator Technology", Driscoll, M.M., et al., IEEE 1986, pp. 365–369.

"A Monolithic Piezoelectric Amplitude Modulator" K.P. Bransalov, Int. J. Electronics, 1979,, vol. 47, No. 6. pp. 545–553.

"Ultralinear Small–Angle Phase Modulator" Lowe et al., Walls Symposium on Frequency Control May 29, 1991, pp. 645–648.

"Temperature Compensated High Couplijng and High . . . Substrates", T. Shiosaki et al., Ultrasonic Symposium, 1984, pp. 405–410.

* cited by examiner

| MATERIAL | RELATIVE PERMITTIVITY |
|---|---|
| BOROSILICATE GLASS | 4.0 |
| SILICA GLASS | 3.78 |
| ALUMINUM SILICATE GLASS | 6.3 |
| LEAD ALKALI GLASS | 9.5 |
| ALUMINA | 8.8 |
| SILICON | 11.8 |
| GALLIUM ARSENIDE | 10.9 |
| GERMANIUM | 16 |

METHOD FOR FABRICATING A THIN FILM BULK ACOUSTIC WAVE RESONATOR (FBAR) ON A GLASS SUBSTRATE

This is a division of Ser. No. 08/734,467, filed Oct. 17, 1996, now abandoned.

FIELD OF THE INVENTION

The invention relates to resonators and, in particular, the invention relates to a method for fabricating Thin Film Bulk Acoustic Wave Resonators (FBARs).

BACKGROUND OF THE INVENTION

It is known to construct Thin Film Bulk Acoustic Wave Resonators (FBARs) on semiconductor wafers including those which are comprised of Silicon (Si) or gallium arsenide (GaAs). For example, in an article entitled "Acoustic Bulk Wave Composite Resonators", Applied Physics Lett., Vol. 38, No. 3, pp. 125–127, Feb. 1, 1981, by K. M. Lakin and J. S. Wang, an acoustic bulk wave resonator is disclosed which comprises a thin film piezoelectric layer of Zinc-Oxide (ZnO) sputtered over a thin membrane of Silicon (Si).

Unfortunately, semiconductor materials have high conductivities and high dielectric permittivity characteristics. These characteristics can have a deleterious effect on piezoelectric coupling efficiency and resonator quality factors, as is described in an article entitled "Temperature Compensated High Coupling and High Quality Factor $ZnO/SiO_2$ Bulk Wave Resonators on High Resistance Substrates", IEEE Ultrasonics Symp., 1984, pp. 405–410, by T. Shiosaki, T. Fukuichi, M. Tokuda, and A. Kawabata.

It is known to reduce ohmic losses exhibited by semiconductor wafers by using semi-insulating semiconductor wafers, as is evidenced by an article entitled "Coplanar Waveguides and Microwave Inductors on Silicon Substrates", IEEE Trans. Microwave Theory Tech., vol. 43, no. 9, pp. 2016–2021, 1995, by Adolfo C. Reyes, Samir M. El-Ghazaly, Steve J. Dorn, Michael Dydyk, Dieter K. Schroder, and Howard Patterson. However, the use of these types of wafers necessitates the use of expensive special grade materials, and does not eliminate the presence of stray capacitances.

Additionally, semiconductor wafers and crystalline wafers need to be carefully polished after being cut from a crystal in order to smooth their surfaces. The polishing process can be expensive.

It would be advantageous to provide a substrate that is formed of a low cost material and which exhibits a low permittivity characteristic and low parasitic capacitances. It would also be advantageous to provide a substrate that is formed of a material that does not need to be polished in order to smooth its surfaces.

It is known to construct so called "bridge" structures on FBAR substrate surfaces using a sacrificial layer that is formed of zinc-oxide (ZnO), as is evidenced by an article entitled "An Air-Gap Type Piezoelectric Composite Thin Film Resonator", IEEE Proc. 39th Annual Symp. Freq. Control, pp. 361–366, 1985, by Hiroaki Satoh, Yasuo Ebata, Hitoshi Suzuki, and Choji Narahara. Similarly, in an article entitled "Multi-layered Ultrasonic Transducers Employing Air-Gap Structure", IEEE Trans. Ultrason. Ferroelec. Freq. Control, vol. 42, no. 3, May 1995, by Susumu Yoshimoto, Masamichi Sakamoto, Ken-ya Hashimoto, and Masatsune Yamaguchi, a multi-layered ultrasonic transducer is disclosed which includes an air gap formed by the removal of a "sacrificial" ZnO layer.

During the fabrication of these types of FBARs, a sacrificial layer of ZnO are deposited (e.g., sputtered) over a substrate. The sacrificial layer is later removed via an etching step that is performed after all of the layers of the FBAR have been completely formed. One drawback of this process is that the steps of sputtering and forming the sacrificial layer can be tedious and time-consuming. This is because ZnO is a ceramic material, and thus is brittle and has a low thermal conductivity. If, by example, very high power is employed during the sputtering of the ZnO, the "target" substrate may break. Also, the growth rate of the ZnO must be controlled to produce a correct crystal orientation and crystallite size distribution. Thus, the growth rate may need to be limited to only 2 $\mu$m/h.

Another drawback of using a sacrificial layer formed of ZnO is that the surface of the crystalline ZnO film is textured, and thus causes acoustic energy scattering losses to occur within the FBAR. Also, the textured surface of the ZnO may cause the surface of a layer (e.g., the bridge layer) formed over the sacrificial ZnO layer to become deformed. A further drawback of employing a sacrificial layer of ZnO is that during the etching of the layer to form an air gap, a piezoelectric ZnO layer that is formed on the sacrificial layer can become damaged.

In view of these problems, it can be appreciated that it would be advantageous to provide a method for fabricating an FBAR using a sacrificial layer that is formed of a material having characteristics that are more beneficial than those of ZnO and other materials conventionally used to form sacrificial layers.

OBJECTS OF THE INVENTION

It is a first object of this invention to provide a Thin Film Bulk Acoustic Wave Resonator (FBAR) having a sacrificial layer that is formed of a material that has more beneficial characteristics than conventional materials that are used to form sacrificial layers.

It is a second object of this invention to provide an improved method for fabricating a Thin Film Bulk Acoustic Wave Resonator (FBAR).

It is a third object of this invention to provide a Thin Film Bulk Acoustic Wave Resonator (FBAR) having a substrate that is formed of a material that has more beneficial characteristics than conventional materials that are used to form substrates.

Further objects and advantages of this invention will become apparent from a consideration of the drawings and ensuing description.

SUMMARY OF THE INVENTION

The foregoing and other problems are overcome and the objects of the invention are realized by a method for fabricating a Thin Film Bulk Acoustic Wave Resonator (FBAR). The method of the present invention employs a sacrificial layer that is comprised of either a metal or polymer material instead of a conventionally-used material such as, by example, zinc-oxide (ZnO). The use of these materials to form sacrificial layers has many advantages over the use of ZnO to form these layers.

In accordance with the method of the invention, a first step includes sputtering a metal such as, be example, copper (Cu) over a substrate. The sputtered Cu is then patterned to form a sacrificial layer.

A next step includes depositing silicon dioxide ($SiO_2$) over the sacrificial layer and over selected portions of the substrate to form a first SiO$_2$ layer (also referred to as a "first protective layer"). This layer may not be needed in cases in which the piezoelectric layer comprises a material which will not be detrimentally affected by the etching of the sacrificial layer (which will be described below). Thereafter, a metallic material such as, by example, gold (Au) is deposited over a selected portion of the first SiO$_2$ layer. The deposited gold is then patterned to form a bottom electrode layer.

A next step includes depositing zinc-oxide (ZnO) over a selected portion of the bottom electrode layer, and over a selected portion of the first SiO$_2$ layer. The ZnO is then patterned to form a ZnO layer (also referred to as a "piezoelectric layer").

A next step of the process includes depositing a further metallic material such as, by example, gold, over a selected portion of the ZnO layer. Thereafter, the deposited gold is patterned to form a top electrode layer. In appropriate cases, a second protective layer may also be formed on the structure to protect the piezoelectric layer during the formation of the vias and/or during the etching of the sacrificial layer which will be described below.

Vias are then formed in the structure so that the sacrificial layer can be removed. Thereafter, the sacrificial layer is removed through the vias to form an air gap.

The fabrication process of the invention may also be performed using a sacrificial layer that is comprised of a polymer instead of a metal. The steps of this process are similar to those described above, except that the steps of depositing, patterning, and removing the sacrificial layer (e.g., the polymer) are performed in a different manner. By example, the step of depositing the polymer is performed by spinning the polymer onto the substrate. The polymer is then patterned to form the sacrificial layer. After each of the other layers and the vias of the FBAR have been formed in the same manner as described above, the sacrificial layer is removed to form the air gap.

The type of polymer used to form the sacrificial layer is preferably one that can withstand the high temperatures that can be reached during the sputtering of the ZnO layer.

In accordance with another aspect of the invention, the method for fabricating FBARs may be performed by removing the sacrificial layer prior to the deposition of the material forming the ZnO layer. For this method, the same steps described above are performed, except that after the first SiO$_2$ layer and the bottom electrode layer have been formed, the sacrificial layer is then removed to form the air gap in the same manner as described above. Thereafter, the steps of forming the ZnO layer and the top electrode layer are carried out in the same manner as described above.

The use of metals and polymers to form sacrificial layers has many advantages over the use of most conventionally-used materials including, by example, ZnO. For example, FBARs having sacrificial layers that are comprised of metals or polymers can he fabricated more quickly than the FBARs having sacrificial layers formed of ZnO. Also, metals and polymers generally have smoother surfaces than ZnO. Moreover, metals and polymers can be etched using chemicals that are not harmful to piezoelectric layers formed of, by example, ZnO.

In accordance with a further aspect of the invention, an FBAR is provided which includes a glass substrate. The FBAR is formed of similar layers as the FBARs described above, and may be fabricated in accordance with the method of the invention. The use of glass to form substrates offers several advantages over the use of other materials to form substrates. Glass is inexpensive and thus can be used to form substrates having large surface areas at an inexpensive cost. Also, most glass materials exhibit low permittivity characteristics and low parasitic capacitances. Moreover, most glass materials become substantially loss free when used in microwave frequency applications.

A further advantage of using glass to form substrates is that, unlike semiconductor materials, glass can have inherently smooth surfaces and thus requires little or no polishing.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

The inventors have developed an improved method for fabricating Thin Film Bulk Acoustic Wave Resonators (FBARs) having air gaps. Unlike most of the conventional methods for fabricating FBARs, which employ sacrificial layers formed of, by example, zinc-oxide (ZnO), the method of the present invention employs a sacrificial layer that is comprised of either a metal or a polymer material. The use of these materials to form sacrificial layers has many advantages over the use of ZnO to form these layers, as will be described below.

The method of fabricating FBARs in accordance with the invention can be understood in view of FIGS. 3a-5. As a first step of the fabrication process, a metal such as, by example, copper (Cu) is sputtered or otherwise deposited over a substrate 42. It is assumed that the substrate is comprised of glass, in accordance with an aspect of this invention which will be further described below, although any other suitable solid material may be employed. The sputtered Cu is then patterned so that it has a thickness of, by example, approximately 2000 nm, thereby forming bridges.

Thereafter, the Cu is wet etched to form tapered edges 44a and 44b. In this manner, a sacrificial layer (also referred to as a "base layer") 44 is formed.

It should be noted that other metals may be used in lieu of copper to form the sacrificial layer 44. By example, the sacrificial layer 44 may be formed of aluminum, zinc, antimony, and any of the elements in the periodic table extending from titanium to copper, from yttrium to silver, and from lanthanum to gold. Ideally, the metals used to form the layer 44 are low cost and can be etched without great difficulty.

Figure 3A:
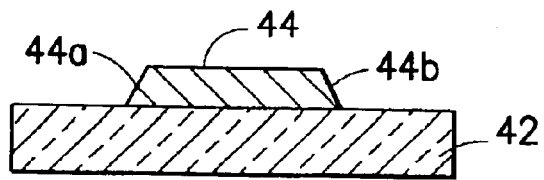
FIG. 3a illustrates a cross section of a portion of a Thin Film Bulk Acoustic Wave Resonator (FBAR) that is formed in accordance with a step of a fabrication process of the invention, for a case in which the portion of the FBAR comprises a sacrificial layer formed of Copper (Cu).
Figure 3B:
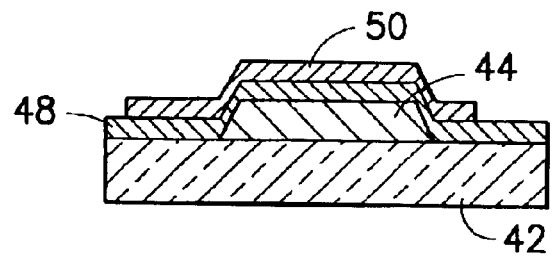
FIG. 3b illustrates a cross section of the FBAR FIG. 3a as it appears after a further step of the fabrication process performed in accordance with the invention.

Referring to FIG. 3b, a next step includes depositing silicon-dioxide ($SiO_2$) over the sacrificial layer 44 and over selected portions of the substrate 42 to form a first $SiO_2$ layer (also referred to as a "first protective layer") 48 having a thickness of, by example, approximately 300 nm. Thereafter, a metallic material such as, by example, gold (Au) is deposited over the a selected portion of the first $SiO_2$ layer 48. The deposited gold is then patterned to form a bottom electrode layer 50 having a thickness of, by example, approximately 300 nm. Other suitable electrically conductive metallic and non-metallic materials call also be employed.

It should be noted that for cases in which the material used to form the piezoelectric layer (to be described below) is not detrimentally effected by the etching of the sacrificial layer (the etching of the sacrificial layer will be described below), it is not necessary to employ the first protective layer 48, and the bottom electrode layer may be formed directly over the sacrificial layer 44 and selected portions of the substrate 42.

Figure 4:
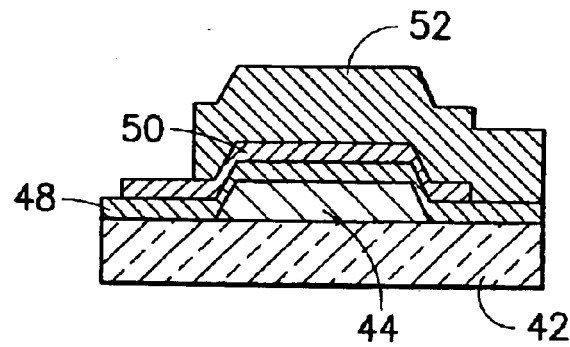
FIG. 4 illustrates a cross section of the FBAR of FIG. 3b as it appears after a further step of the fabrication process performed in accordance with the invention.

Referring to FIG. 4, a next step includes depositing zinc-oxide (ZnO) over a selected portion of the bottom electrode layer 50, and over a selected portion of the first $SiO_2$ layer 48. The ZnO may be deposited by, for example, sputtering from a target in a mixture of Argon (Ar) and $O_2$. After the ZnO is deposited, it is patterned to form a ZnO layer (also referred to as a "piezoelectric layer") 52 having a selected thickness (e.g., approximately 2000 nm) that is a function of a desired resonant frequency of the FBAR.

Figure 5:
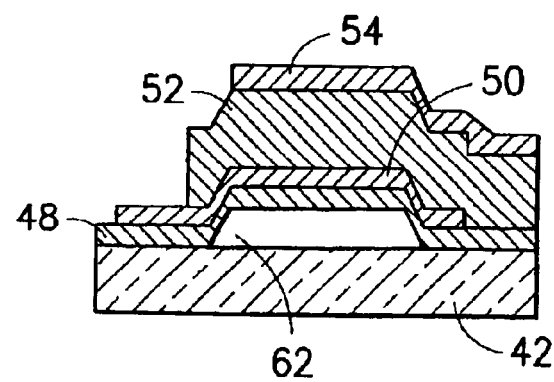
FIG. 5 illustrates a cross section of the FBAR resonator of FIG. 4 as it appears after a further step of the fabrication process performed in accordance with the invention.

A next step of the process includes depositing a further metallic material such as, by example, gold, over a selected portion of the ZnO layer 52. Thereafter, the deposited gold is patterned to form a top electrode layer 54, which is illustrated in FIG. 5. As with the first electrode layer 50, other suitable electrically conductive metallic and non-metallic materials can also be employed.

Figure 2A:
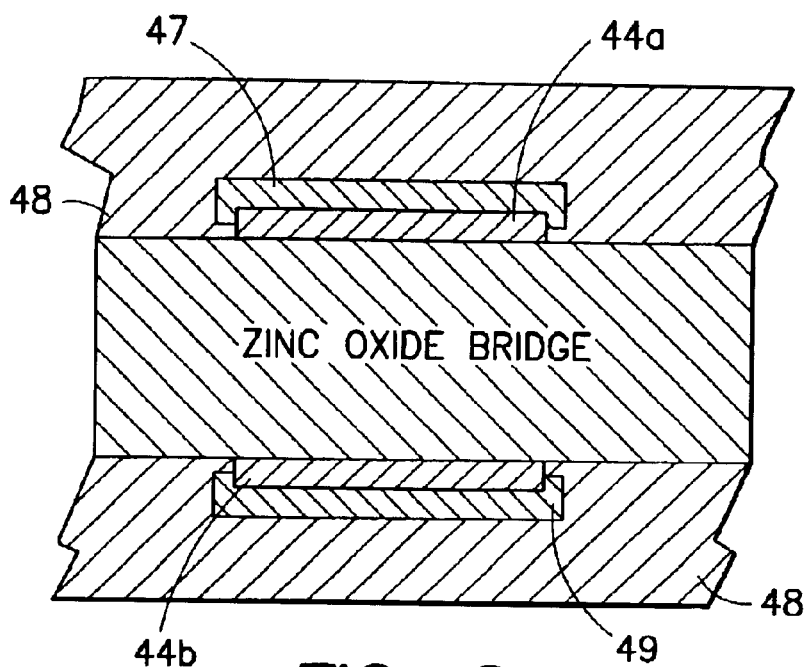
FIG. 2a illustrates a top view of a portion of an exemplary FBAR having vias.

Vias are then formed in the structure so that the sacrificial layer 44 can be removed. The vias may be formed in any suitable manner. For example, and referring to FIG. 2a, selected portions of the first SiO2 layer 48 may be removed to provide openings 47 and 49 for accessing the sacrificial layer 44 (tapered edges 44a and 44b are shown). It should be noted that in cases where it is appropriate to protect the piezoelectric layer 52 during the creation of the vias and/or the removal of the sacrificial layer, a second layer of $SiO_2$(also referred to as a "second protective layer") (not illustrated in FIG. 2a) may be employed. By example, $SiO_2$ may be deposited and patterned on a selected portion of the piezoelectric layer 52 after the piezoelectric layer 52 has been formed and before the top electrode layer 54 has been formed. The $SiO_2$ is then patterned to form a contact area on a top portion of the ZnO layer 52. Within the contact area the top electrode layer 54 is then formed. In other cases where it is appropriate, the second protective layer may instead be formed after the formation of the top electrode layer 54 on the piezoelectric layer 52.

Figure 2B:
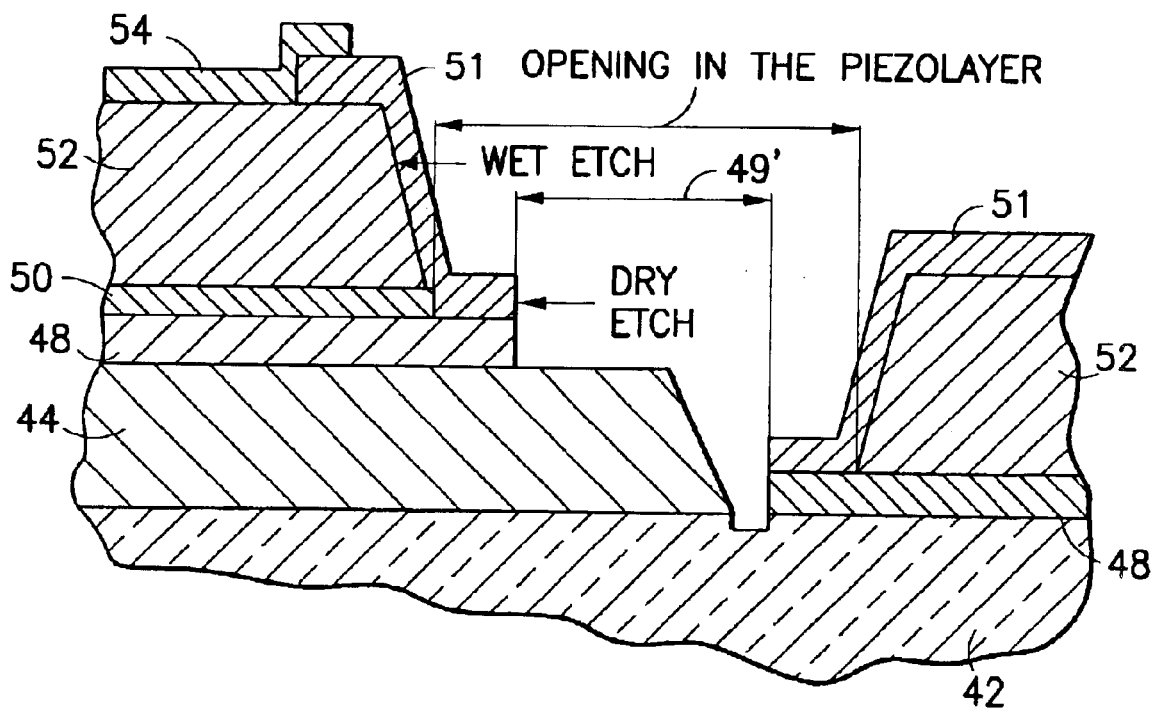
FIG. 2b illustrates a cross section of a portion of an exemplary FBAR.

Vias may also be formed in the structure according to the example shown in FIG. 2b. For this example, holes may be formed in the ZnO layer 52 by an using an acid etchant. Selected portions of the FBAR and the surrounding wafer may then be covered by depositing a second protective layer of $SiO_2$ 51 via, for example, a plasma-enhanced chemical vapor deposition (CVD). The $SiO_2$ is then patterned in fluorine plasma (F plasma) to form a contact area on a top portion of the ZnO layer 52. Then, the top electrode layer 54 is formed over the contact area and over portions of the second layer of $SiO_2$ 51. Thereafter, selected portions of the second layer of $SiO_2$ 51 and selected portions of the first SiO2 layer 48 are patterned to form vias (via 49' is shown in FIG. 2b). For this example, it should be noted that as described above with respect to FIG. 2a, instead of depositing and patterning the second protective layer 51 prior to the formation of the top electrode layer 54, the second protective layer 51 may be deposited and patterned after the formation of the top electrode layer 54.

A next step of the fabrication process includes removing the sacrificial layer 44 through the vias by wet etching to form an air gap 62. The etching may be performed by using, for example, acids, alkalis, or redox reactions (e.g., ferric chloride). Either selective or non-selective etching may be used.

In order to determine whether the device is correctly tuned, the electrical performance characteristics of the device can then be measured in a suitable manner and compared with a model of the device. Any suitable technique may be employed for modeling the device including that disclosed in an article entitled "Systematic Design of Stacked-Crystal Filters by Microwave Network Methods", IEEE Trans. Microwave Theory Tech., vol. MTT-22, pp. 14–25, January 1974, by Arthur Ballato, Henry L. Bertoni, and Theodor Tamir.

Figure 6A:
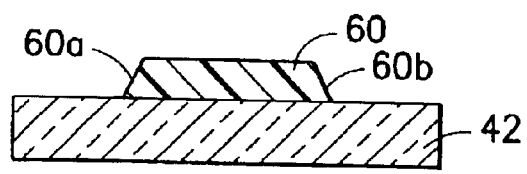
FIG. 6a illustrates a cross section of a portion of Thin Film Bulk Acoustic Wave Resonator (FBAR) that is formed in accordance with a step of the fabrication process of the invention, for a case in which the portion of the FBAR comprises a sacrificial layer formed of a polymer material.
Figure 6B:
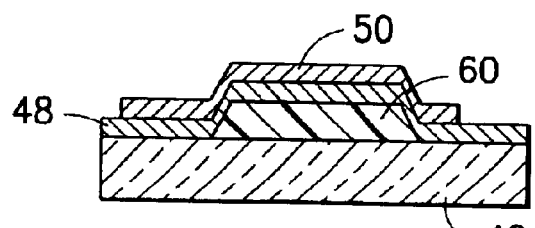
FIG. 6b illustrates a cross section of the FEAR FIG. 6a as it appears after a further step of the fabrication process performed in accordance with the invention.
Figure 7:
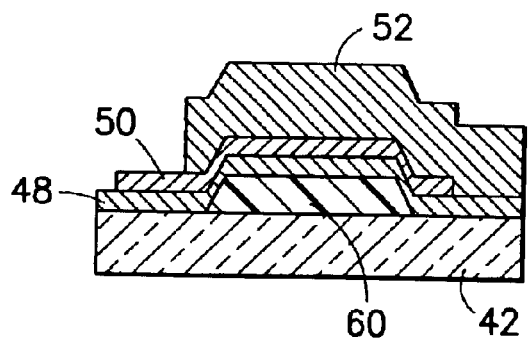
FIG. 7 illustrates a cross section of the FBAR of FIG. 6b as it appears after a further step of the fabrication process performed in accordance with the invention.
Figure 8:
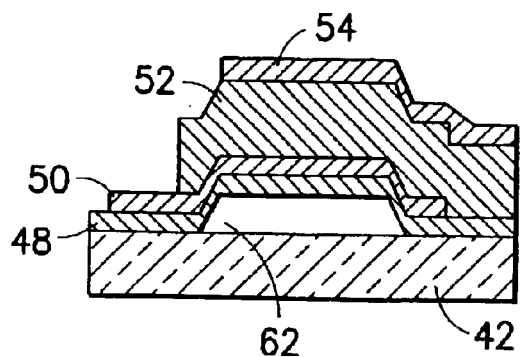
FIG. 8 illustrates a cross section of the FBAR of FIG. 7 as it appears after a further step of the fabrication process performed in accordance with the invention.
Figure 9A:
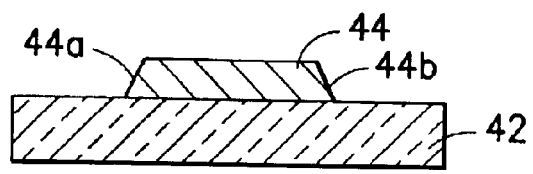
FIG. 9a illustrates a cross section of a portion of a Thin Film Bulk Acoustic Wave Resonator (FBAR) that is formed in accordance with a step of an alternate fabrication process of the invention.
Figure 9B:
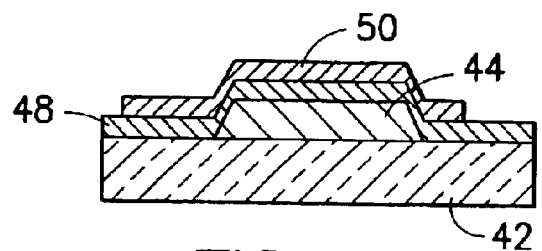
FIG. 9b illustrates a cross section of the FBAR FIG. 9a as it appears after a further step of the alternate fabrication process of the invention.
Figure 10:
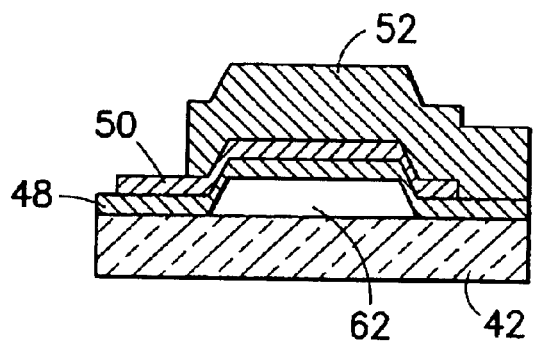
FIG. 10 illustrates a cross section of the FBAR of FIG. 9b as it appears after a further step of the alternate fabrication process of the invention.
Figure 11:
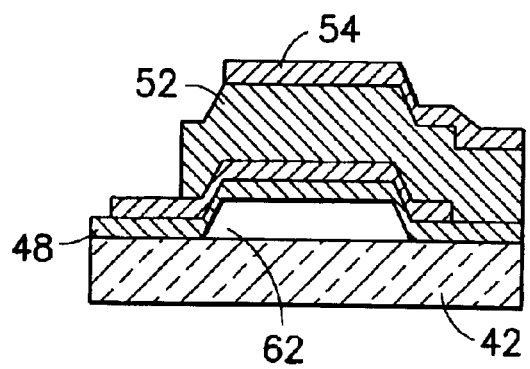
FIG. 11 illustrates a cross section of the FBAR resonator of FIG. 10 as it appears after a further step of the alternate fabrication process of the invention.

FIGS. 6a-8 illustrate steps of the fabrication process of the invention using a sacrificial layer that is formed of a polymer instead of a metal. The steps of this process are similar to those described above, except that the steps of depositing, patterning, and removing the sacrificial layer (e.g., the polymer) are performed in a different manner. Referring to FIG. 6a, by example, the step of depositing the polymer is preferably performed by spinning the polymer onto the substrate 42 thereby providing an inherently smooth surface for further processing. The polymer is then patterned so that it has a thickness of, by example, approximately 1000 nm, thereby forming bridges. The polymer is also etched to form tapered edges 44a and 44b in a similar manner as described above. In this manner, sacrificial layer 60 is formed. After each of the other layers and the vias of the FBAR have been formed in the same manner as described above (FIGS. 6b and 7), the sacrificial layer 60 is then removed by, for example, etching or plasma ashing. In this manner, air gap 62 is formed, which is illustrated in FIG. 8.

For cases in which organic polymers are used to form the sacrificial layer 60, the sacrificial layer 60 can be etched in, by example, a plasma containing oxygen. For cases in which silicone polymers are used, for example, an addition of fluorine may be necessary.

Also, some types of polymers can be dissolved in organic solvents (e.g., acetone). Unlike the corrosive chemicals that are used for, by example, anisotropic etching of silicon, organic solvents do not attack ZnO. Thus, polymers which can be dissolved by organic solvents are preferred. Also, the use of this type of bridge structure avoids drawbacks that can associated with the performance of, by example, deep anisotropic etching of silicon, which requires the etching of a large surface area because the etch stopping crystal plane is angled at, by example, only 54.74 degrees with-respect to the surface of the wafer.

The type of polymer used to form the sacrificial layer 60 is also preferably one that can withstand the high temperatures that can be reached during the sputtering of the ZnO layer 52. The polymer may be, by example, polytetrafluoroethylene or a derivative thereof, polyphenylene sulfide, polyetheretherketone, poly(para phenylene benzobismidazole), poly(para phenylene benzobisoxazole), poly (para phenylene benzobismidazole), poly (para phenylene benzobisthiazole), a polyimide, polyimide siloxane, vinyle ethers, polyphenyl, parylene-n, parylene-f, benzocyclobutene.

In accordance with another aspect of the invention, the method for fabricating FBARs may be performed by removing the sacrificial layer prior to the deposition of the material forming the ZnO layer 52. This may be understood in view of FIGS. 9a-11 wherein portions of an exemplary FBAR that is formed in accordance with this method of the invention are illustrated. The FBAR includes a sacrificial layer 44 formed of, by example, copper (Cu). For this method, the same steps described above are performed, except that after the first SiO$_2$ layer 48, the bottom electrode layer 50, and the vias have been formed, the sacrificial layer 44 is then removed to form the air gap 62 in the same manner as described above. Thereafter, the steps of forming the ZnO layer 52 and the top electrode layer 54 are carried out in the same manner as described above.

The use of metal or polymer materials to form sacrificial layers enables the fabrication process to be performed more quickly than the fabrication processes employing sacrificial layers that are formed of, by example ZnO. This is because ZnO is a brittle ceramic material and thus requires more time to be deposited than metals or polymers which are not as brittle as ZnO.

The use of polymers or metals to form sacrificial layers also avoids problems that can be associated with the use of most conventionally-used materials (e.g., zinc-oxide) to form such layers. By example, unlike some materials, metals have small grain sizes, and thus have naturally smooth surfaces. Also, polymers can be spun-on during the fabrication of FBAR structures, and develop smooth surfaces during baking while the polymer reflows in a liquid state. As a result, the layer formed over the polymer sacrificial layer does not experience surface deformations that are as serious as those which can occur to layers deposited over most conventionally-used materials (e.g., ZnO).

Another advantage of using metals or polymers to form sacrificial layers instead of, by example, ZnO is that metals and polymers can be etched using chemicals that are not harmful to the ZnO layer 52.

Figures 1A, 1B:
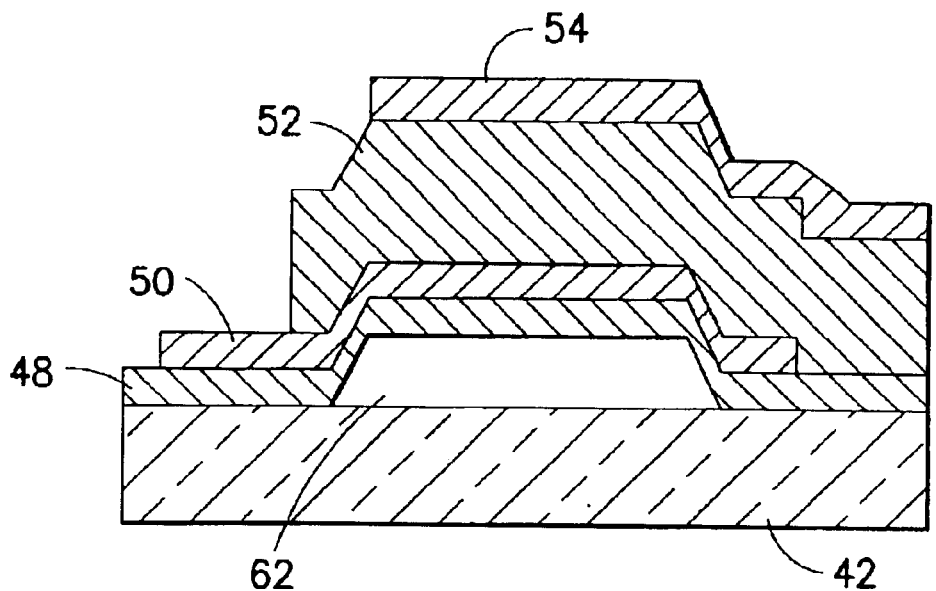
FIG. 1a illustrates a cross section of an exemplary FBAR having a glass substrate.
FIG. 1b illustrates a table showing permittivities for various types of materials.

In accordance with a further aspect of the invention, an FBAR is provided which includes a glass substrate 42, as is illustrated in FIG. 1a. The FBAR is formed of similar layers as the FBARs described above, and may be fabricated in accordance with the method of the invention.

The use of glass to form substrates offers several advantages over the use of semiconductor materials to form substrates. One advantage is that glass is inexpensive. Thus, glass can be used to form chips having large surface areas at an inexpensive cost, thus providing more surface area for bonding. Active components such as, by example, transistors and integrated circuits (ICs) can be added onto the chips by, for example, flip-chip technology.

Also, most glass materials including, by example, silicate glass, have low permittivity characteristics, and hence exhibit low parasitic capacitances. Thus, unlike semiconductor materials, which normally have high conductivities and high dielectric permittivity characteristics, glass substrates do not exhibit detrimental characteristics such as, by example, low piezoelectric coupling efficiencies and low resonator quality factors. FIG. 1b illustrates a table showing the respective permittivities of various types of materials.

In addition, most glass materials except, by example, soda-lime glass, are substantially loss free when being used in microwave frequency applications.

A further advantage of using glass to form substrates is that, unlike semiconductor materials, most glasses have naturally smooth surfaces. Thus, little or no polishing is required to smooth the surfaces of glass substrates as is required to smooth the surfaces of substrates formed of semiconductor materials.

Moreover, the thermal expansion characteristics of most types of glass materials are more similar to those of the other materials forming the FBAR layers than are the thermal expansion characteristics of, by example, silicon. As such, in a bonding application, a component may be encapsulated in glass.

It should be noted that the types of technologies that are available for micromachining glass substrates are not as diverse as those available for micromachining substrates formed of crystalline semiconductor materials.

While the invention has been particularly shown and described with respect to preferred embodiments thereof, it will be understood by those skilled in the art that changes in form and details may be made therein without departing from the scope and spirit of the invention.

What is claimed is:

1. A method for fabricating a Thin Film Bulk Acoustic Wave Resonator (FBAR), comprising the steps of:

STEP A: forming a sacrificial layer on a selected portion of a substrate, wherein the sacrificial layer comprises one of a metal and a polymer;

STEP B: forming a bottom electrode layer on the sacrificial layer and on selected portions of the substrate;

STEP C: forming a piezoelectric layer on a selected portion of the bottom electrode layer and on a selected portion of the substrate;

STEP D: forming a top electrode layer on a selected portion of the piezoelectric layer;

STEP E: removing the sacrificial layer to form an air gap beneath at least a portion of the bottom electrode layer;

wherein STEP A is performed by the steps of

STEP 1: depositing one of the metal and the polymer over the substrate; and

STEP 2: patterning the deposited one of the metal and the polymer to form the sacrificial layer;

wherein STEP E is performed by etching the sacrificial layer using a chemical that is not harmful to the piezoelectric layer; and wherein between the performances of STEPS D and E, a step is performed of:

forming at least one via through at least one of the layers formed in STEPS B-D so that the sacrificial layer can be removed through the at least one via, thereby forming an RF resonator.

2. A method as set forth in claim 1, wherein STEP A is performed by the steps of:

STEP 1: depositing the metal over the substrate; and

STEP 2: patterning the deposited metal to form the sacrificial layer.

3. A method as set forth in claim 2, wherein the sacrificial layer has a thickness of about 2000 nm.

4. A method as set forth in claim 2, wherein the metal is comprised of copper (Cu).

5. A method as set forth in claim 1, wherein STEP A is performed by the steps of:

STEP 1: spinning the polymer onto the substrate; and

STEP 2: patterning the polymer to form the sacrificial layer.

6. A method as set forth in claim 5, wherein the sacrificial layer has a thickness of about 1000 nm.

7. A method as set forth in claim 1, wherein the protective layer comprises $SiO_2$ having a thickness of about 300 nm.

8. A method as set forth in claim 1, wherein the bottom electrode layer comprises an electrically conductive metal having a thickness of about 300 nm.

9. A method as set forth in claim 1, wherein the piezoelectric layer comprises zinc-oxide (ZnO) having a thickness of about 2000 nm.

10. A method as set forth in claim 1, wherein the top electrode layer is comprised of an electrically conductive metal having a thickness of about 300 nm.

11. A method as set forth in claim 1, wherein the sacrificial layer is formed of metal, and wherein STEP E is performed by wet etching the sacrificial layer.

12. A method as set forth in claim 1, wherein the sacrificial layer is formed of the polymer, and wherein STEP E is performed by one of the steps of etching the sacrificial layer and plasma ashing the sacrificial layer.

13. A method as set forth in claim 1, wherein the polymer material can survive the performance of STEP C at an elevated temperature.

14. A method as set forth in claim 1, wherein the substrate is comprised of a solid material.

15. A method as set forth in claim 1, wherein STEP E is performed between the performances of STEP B and STEP C.

16. A method as set forth in claim 1, wherein the piezoelectric layer comprises zinc-oxide (ZnO) having a thickness that is a function of a desired resonant frequency of the FBAR.

17. A method as set forth in claim 1, wherein the substrate is comprised of a glass.

* * * * *

UNITED STATES PATENT AND TRADEMARK OFFICE
CERTIFICATE OF CORRECTION

PATENT NO. : 6,839,946 B2
DATED : January 11, 2005
INVENTOR(S) : Ylilammi et al.

It is certified that error appears in the above-identified patent and that said Letters Patent is hereby corrected as shown below:

Column 10,
Line 14, after the word "of", please insert -- the --

Signed and Sealed this

Third Day of May, 2005

JON W. DUDAS
*Director of the United States Patent and Trademark Office*